April 10, 1962 D. E. SUNSTEIN 3,028,728

TEMPERATURE RESPONSIVE SIGNAL AMPLIFIER

Filed April 3, 1958

INVENTOR.
DAVID E. SUNSTEIN
BY
Trachtman + Zoda
ATTORNEYS.

United States Patent Office 3,028,728

Patented Apr. 10, 1962

3,028,728
TEMPERATURE RESPONSIVE SIGNAL AMPLIFIER

David E. Sunstein, Bala-Cynwyd, Pa., assignor to General Atronics Corporation, Bala-Cynwyd, Pa., a corporation of Pennsylvania Filed Apr. 3, 1958, Ser. No. 726,178
11 Claims. (Cl. 60—23)

Figure 1:
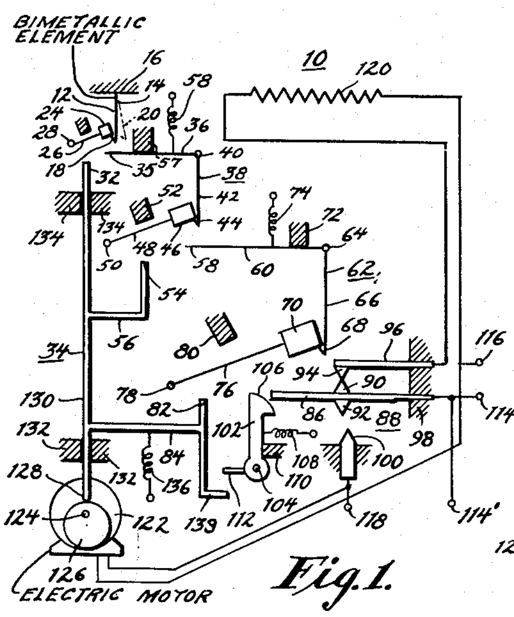

The invention relates to signal amplifiers, and more particularly to signal amplifiers of the thermal type.

Heretofore in order to achieve signal amplification by the use of thermal amplifiers, it has been necessary to arrange the amplifiers in cascade. This has been undesirable because of the successive thermal time delays introduced by such an arrangement. The time delays associated with such amplifiers are in many instances, troublesome and such apparatus has therefore lacked general utility. The utilization of plurality of such thermal devices to obtain amplification has also correspondingly multiplied the cost of such apparatus.

It is therefore an object of invention to provide a new and improved signal amplifier utilizing a single thermal element which provides a high degree of amplification without an increase in time delay response.

Another object of invention is to provide a new and improved signal amplifier utilizing a thermal responsive element and non-thermal means for amplifying the response of the thermal element.

Another object of invention is to provide a new and improved signal amplifier which may be manually or automatically reset on a periodic basis.

Another object of invention is to provide a new and improved signal amplifier responsive to small variations in the temperature and having a high degree of sensitivity.

Another object of invention is to provide a new and improved signal amplifier which is highly reliable and efficient in operation, easily manufactured, and inexpensive in cost.

Another object of invention is to provide a new and improved signal amplifier of the thermal type having high utility and being readily modified for utilization under various design requirements.

The above objects as well as many other objects of the invention are achieved by providing a signal amplifier comprising a temperature sensitive bimetallic element having a fixed extremity and an extremity movable between first and second positions responsive to temperature. A load is retained in a first position by the movable extremity of the element when the extremity is in its first position. The load is released by the bimetallic element when its extremity moves from its first position towards the second position. The load when released moves from its first position to a second position of lower potential energy than its first position. An output means is actuated by the load upon its release by the bimetallic element to produce an output signal. A load restoring means is provided for placing the load in its first position for retention by the bimetallic element when the extremity of the element is in its first position.

An increase in the amplification of the output signal may be obtained by increasing the difference in potential energy of the load when moving from its first to second position, or by utilizing a plurality of loads which are successively released by the action of the preceding load moving from its position of higher to lower potential. Each succeeding load performs a greater amount of work in its translation from its higher to lower potential positions, the final load actuating the output device to provide a correspondingly amplified output signal.

The amplifier may be provided with mechanical means periodically resetting the loads from their second to first positions preparatory to the delivery of an output signal. The loads may also be reset by supporting them by use of bimetallic elements and raising the temperature of the bimetallic elements for positioning the loads to their reset locations.

Figure 2:
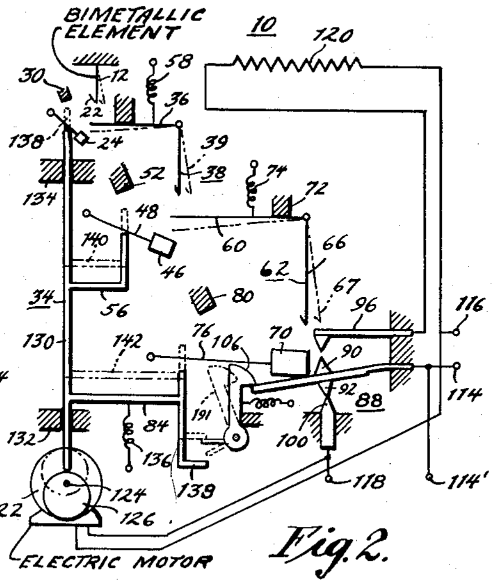
Figure 3:
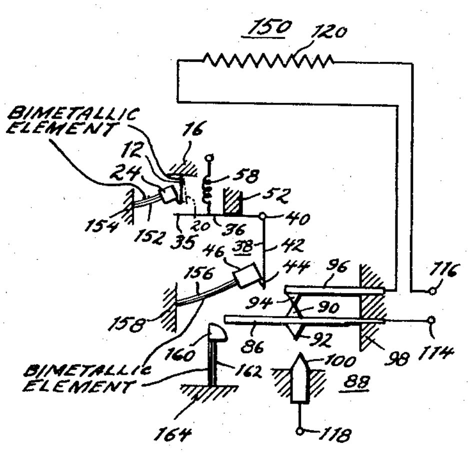
Figure 4:
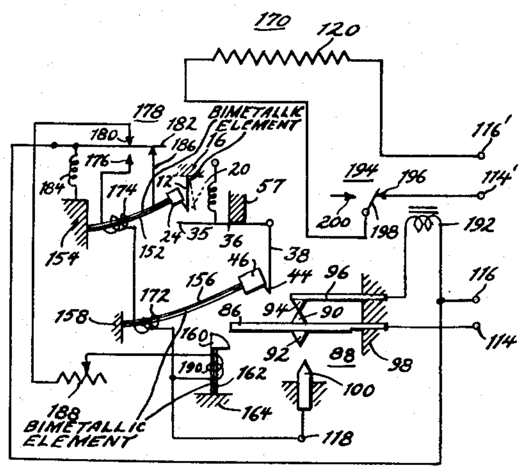

The foregoing and other objects of the invention will become more apparent as the following detailed description of the invention is read in conjunction with the drawings, in which:

FIGURE 1 is a diagrammatic representation of a signal amplifier embodying the invention, FIGURE 2 is the signal amplifier shown in FIGURE 1 after it has delivered an output signal and prior to being reset, FIGURE 3 is a diagrammatic representation of a modified form of signal amplifier shown in FIGURE 1, and FIGURE 4 is a further modified form of the signal amplifier shown in FIGURE 1.

Like reference numerals designate like parts throughout the several views.

The FIGURES 1 and 2 are diagrammatic representations of a signal amplifier 10 embodying the invention. A temperature sensitive element 12 has one end 14 connected with a support 16 and its other end 18 movable between first and second positions responsive to temperature. The bimetallic element 12 may be made of two strips of metal having different temperature coefficients of expansion causing the element 12 to alter its curvature with variations in temperature. Such bimetallic elements 12 are well known in the art. When the temperature of the bimetallic element increases, its movable end 18 is caused to move from its first position, shown by the solid lines in FIGURE 1, towards its second position shown by the dashed lines at 20.

The movable extremity 18 of the bimetallic element 12 is provided with a hook 22 (FIGURE 2) for engaging and retaining a load 24.

The load 24 which may be in the form of a weight is secured with the end of a lever 26 having its other end pivoted at 28. By this means the load 24 is movable between a first position shown in FIGURE 1, and a second position shown in FIGURE 2. The stop 30 and the end 32 of the resetting means 34 limit the motion of the load 24 to movement substantially between its first and second positions.

The load 24 is retained in its first position by the hook 22 of the bimetallic element 12 when it is in its first position as shown in FIGURE 1. When the bimetallic element 12 due to increase in its temperature moves towards its second terminal position the load 24 is released. Since the potential energy of the load 24 is greater in its first position than in its second position, it is caused to move, or in this case fall under the action of gravity, to its second position.

As the load 24 moves from its first to second position, it engages the end 35 of the horizontal arm 36 of a load retaining element 38. The load retaining element 38 is pivoted at 40, and is also provided with a second substantially vertical arm 42 having a hook at its extremity 44 for engaging a second load 46.

The second load 46 has a weight greater than that of the first load 24, and is secured at the end of a lever 48 pivoted at 50. The load 46 is thus supported for movement between the first position shown in FIGURE 1 and a second position of lower potential energy shown in FIGURE 2. The motion of the weight is substantially restricted to that between its first and second positions by the stop 52 and the end 54 of the arm 56 of the load resetting means 34.

The load 46 is retained in its first position by the hook end 44 of the load retaining means 38 when in its first position shown in FIGURE 1. The load retaining means 38 is normally retained in its first position against a stop 57 by the action of a spring 58.

The load 46 moving from its first to second positions engages the end 58 of the horizontal arm 60 of a load retaining element 62. The element 62 is pivoted at 64 and has a substantially vertical arm 66 with a hook end 68 for engaging and retaining a third load 70. The element 62 is movable between first and second positions and is urged towards its first position in abutment with stop 72 by a spring 74.

The load 70 has a weight greater than that of the load 46 and is connected to the end of a lever 76 having its other end pivoted at 78. The load 70 as connected is movable between a first position shown in FIGURE 1 and a second position shown in FIGURE 2. The load 70 is substantially limited to movement between these positions by a stop 80 and the end 82 of the arm 84 of the load resetting means 34.

The load 70 has a greater potential energy in its first position than in its second position. Thus when the load 70 is released by the movement of the retaining element 62 towards its second position shown by the dashed lines at 67 in FIGURE 2, the load 70 is accelerated towards its second position. After its momentum is sufficiently increased, the load 70 strikes the extending arm 86 of a signal output means 88.

The signal output means 88 includes contacts 90 and 92 on opposite sides of the extending arm 86. The contact 90 is adapted for engaging a contact 94 of a second arm 96. The arms 86 and 96 are relatively positioned with respect to each other by being supported in an insulator 98. The output means 88 when in its first position (see FIGURE 1) causes engagement of the contacts 90 and 94, while in its second position as shown in the FIGURE 2 provides electrical engagement between its contact 92 and a contact 100 of the signal output means 88.

The signal output means 88 is normally in its first position, but may be maintained in its second position by a hook retainer 102. The hook retainer 102 is pivoted at 104 and is provided with the top inclined surface 106 for causing the hook 102 to rotate in the counterclockwise direction when the signal output means 88 is urged towards its second position. The spring 108 biases the hook retainer 102 in the clockwise direction towards engagement with the stop 110 for retaining the output means 88 in its second position. The hook retainer 102 is also provided with an extension 112 for imparting a counterclockwise torque to the hook retainer 102 for releasing the output means 88 from its second position, allowing it to assume its first position. This is explained in greater detail below in connection with the description of the resetting means 34.

The signal output means 88 may be provided with terminals 114, 114′, 116 and 118. The terminal 114 is connected with the arm 86 which may be made of a resilient metallic conducting material, while the terminal 116 may be connected through a load such as a heating coil element 120 to the arm 96 which is also made of a conducting material. The terminal 114′ may be connected with terminal 114, while terminal 118 is joined with the electrical contact 100.

The resetting or load restoring means 34 of the amplifier 10 includes an electric motor 122 which may be periodically energized to rotate its shaft 124. The shaft 124 of the motor 122 drives an eccentric cam wheel 126. The end 128 of the vertical shaft 130 of the load restoring means 34 engages the camming surface of the wheel 126. Rotation of the cam wheel 126 imparts a vertical reciprocating motion to the shaft 130 which is positioned and guided by pairs of guide means 132 and 134. As previously noted, the arms 56 and 84 which are connected with the rod 130 similarly execute vertical reciprocating motions. The spring 136 is connected with the arm 84 of the restoring means 34 and urges the rod 130 in a downward direction for maintaining its end 128 in contact with the cam wheel 126. The FIGURES 1 and 2 illustrate the rod 130 in its lowest position, while the dashed lines 138, 140 and 142 illustrate respective positions of rod 130 and its arms 56 and 84 at their highest positions.

When the rod 130 of the restoring means 34 is in its lowest position, it has already been noted that the ends 32, 54 and 82 provide a limit to the downward motion of the loads 24, 46 and 70. When the rod 130 is actuated towards its higher position the ends 32, 54 and 82, respectively, engage the levers 26, 48 and 76 causing their loads 24, 46 and 70 to be placed in their first positions. If the bimetallic element 12 is in its first position shown by the solid line in the figures, then it will act to retain the load 24 in its first position. It is noted that the slope on the hook 22 of the element 12 permits the load 46 to proceed towards its first position by allowing the element 12 to be displaced, but after the load 24 is in its first position the element 12 positively engages and retains the load 24 by its hook action.

If the load 24 is retained in its first position by the element 12, then the other loads 46, and 70 will also be maintained in their first positions by their respective retaining elements 38 and 62. However, if the load 24 is not retained by the element 12, the loads 48 and 70 will not remain in their first positions. This is due to the action of load 24 which engages the retaining element 38 in its downward motion and causes the release of the weight 46. In turn, the weight 46 actuates the retaining element 62 towards its second position, releasing the load 70. It is also noted that the horizontal arms 36 and 60 of the retaining elements 38 and 62 are sufficiently flexible to permit the deflection of their ends 35 and 58 by the passage of the loads 24 and 46 from their second to their first positions.

The arm 84 of the rod 130 of the restoring means 34 is provided with a horizontal extension 139 for engaging the extension 112 of the hook retainer 102. The extension 112 of the hook retainer 102 is sufficiently flexible to allow its deflection when the extension 139 moves past its end in the upward direction. The passage of the extension 139 in the downward direction engages the extension 112 of the hook retainer 102 and causes it to pivot in the counterclockwise direction as shown by the dashed lines at 191 in the FIGURE 2. This counterclockwise rotation of the hook 102 acts to assure that the signal output means 88 is placed in its first position.

The thermal amplifier 10 operates in the following manner. With the amplifier 10 set as shown in FIGURE 1, the temperature sensitive bimetallic element 12 is in its first position retaining the load 24 in its first position. When the temperature of the bimetallic element 12 increases, which may be due to heat supplied by the heating element 120 or otherwise such as by increases in ambient temperature, the bimetallic element 12 moves towards its second position shown by the dashed lines at 20. The amplifier 10 is highly sensitive so that a slight increase in temperature sufficiently moves the element 12 towards its second position to that the load 24 is disengaged or released.

The load 24 falls towards its second position of lower potential energy and delivers an impact force to the end 35 of the retaining element 38. The retaining element 38 is caused to pivot in the counterclockwise direction toward its second position shown by the dashed lines 39 releasing the heavier load 46. Load 46 similarly drops through the gravitational field towards its second position and delivers an impact force to the end 58 of the load retaining means 62. The impact delivered to the element 62 causes its counterclockwise rotation towards its second position shown by the dashed lines 67 in FIGURE 2. This releases the load 70 of increased weight which is accelerated towards its second position and delivers an impact force to the extending lever 86 of the signal output means 88.

The end of the lever 86 is deflected under the impact force so that it assumes its second position shown in the FIGURE 2. The arm 86 is retained in its second position by the hook retainer 102 as previously explained. In moving from its first to second position the arm 86 of the output signal means 88 disengages the contacts 90 and 94, while engaging the contacts 92 and 100. Thus, if energization was supplied to the terminals 114 and 116 for generating heat at the element 120 when the signal output means 88 is in its first position, such energization is interrupted, while a circuit is completed between terminals 114' and 118 for delivering an output signal responsive to the position of the signal output means 88.

By reducing the weight of the load 24, the sensitivity of the bimetallic element 12 may be greatly increased. However, by the arrangement of the amplifier 10, the force or signal delivered by the load 24 is greatly amplified and a considerably greater force is delivered by the load 70. Of course, the number of stages of amplification represented by the successive loads 24, 46, 70 may be increased or decreased according to the amplification required.

After the delivery of an output signal, the amplifier 10 may be reset or conditioned for the delivery of a succeeding output signal. The means by which this is accomplished will be described in connection with FIGURES 1 and 2. The FIGURE 1 shows the signal amplifier 10 in condition for delivering an output signal, while the FIGURE 2 shows the apparatus 10 immediately after delivering an output signal. The apparatus 10 is reset to its position shown in FIGURE 1 by the restoring means 34 which may be accomplished at given intervals by periodically energizing the electric motor 122. Energization of the electric motor 122 causes the rotation of the cam wheel 126 and produces a reciprocating motion in the rod 130. When the rod moves from its lowest position to its highest position, the loads 24, 46 and 70 are caused to assume their first positions as previously explained.

If the temperature of the bimetallic element 12 has been sufficiently reduced to cause it to assume its first position, it will retain the load 24 in its first position. Under such circumstances the loads 46 and 70 will also be respectively retained by their elements 38 and 62 in their first positions. After the restoring rod 34 has reached its highest position as indicated by the dashed lines 138, 140 and 142 in FIGURE 2, it continues to move downwardly to its lowest position. If the load 24 is not retained in its first position by the bimetallic element 12, it is accelerated towards its second position. In moving towards its second position, the load 24 acts to release the load 46 which in turn acts to release load 70 so that they all assume their second positions.

This action of the restoring means 34 continues periodically until the temperature of the bimetallic element 24 is sufficiently reduced so that it assumes its first position and maintains the load 24 in its first position. Under these circumstances the signal amplifier 10 will assume the condition shown in FIGURE 1 preparatory for the production of an output signal. In this connection, it is noted that the extension 139 of restoring means 34 acts to release the signal output means 88 from its second position so that it may assume its first position shown in FIGURE 1. However, if after the action of the restoring means 34 the load 24 is not retained in its first position, the signal output means 88 is caused to reassume its second position by the impact delivered by load 70 returning to its second position.

In this way the signal output means 88 is caused to reassume its second position interrupting the delivery of energization to the heating coil 120 until the temperature of the bimetallic element 12 is sufficiently reduced. When the temperature of the element 12 is sufficiently reduced the action of the restoring means 34 is effective in resetting the signal amplifier 10 with its output means 88 in its first position. This allows resumption of energization of the heating coil 120 for increasing the temperature of the element 12. When the element 12 has its temperature sufficiently increased to cause its movement towards its second position, the load 24 is released from its first position to initiate the delivery of an output signal by the output signal means 88.

Although a heating element 120 has been included with the amplifier 10 to illustrate temperature feedback control, the amplifier 10 may be used for other applications which do not include temperature feedback control. It is also noted that the bimetallic element 12 may be positioned to have its end 18 moved from its first towards its second position with decreasing temperature rather than increasing temperature. The utilization and modification of the signal amplifier 10 for application to various design circumstances will be obvious to those skilled in the art.

The FIGURE 3 diagrammatically illustrates a signal amplifier 150 which is a modified form of the amplifier 10. Therefore, the description of the amplifier 10 is similarly applicable to the amplifier 150 except for the particular features which are about to be described.

The amplifier 150 utilizes a different means for restoring itself to its set condition preparatory to the delivery of output signal. The amplifier 150 also only illustrates the use of two loads 24 and 46 instead of the three loads of amplifier 10. The load 24 is also connected to the end of a bimetallic lever 152 which has its other end connected to a support 154. The load 46 is similarly connected to a bimetallic lever 156 which has its other end connected to support 158. The hook means 160 is connected to the end of a bimetallic element 162 which has its other end connected to a support 164. The bimetallic elements 152, 156 and 162 are made of materials having different coefficients of expansion resulting in the movement of the unsupported ends responsive to changes in temperature.

The signal amplifier 150 with its loads 24 and 46 in their first positions as shown in FIGURE 3, is conditioned for delivering an output signal. As the temperature increases the temperature sensitive bimetallic element 12 is caused to move from its first position toward its second position shown by the dashed lines 20. With the increase in temperature, the bimetallic levers 152 and 156 also are strained for urging their loads 24 and 46 in a downward direction. Thus, when the weight 24 is released by the element 12 it is accelerated by the action of the bimetallic lever 152 in the downward direction. This delivers the impact to the load retaining element 38 causing the release of the load 46. Since the bimetallic element 156 has also been pre-strained it exerts a force upon the weight 46 accelerating it in a downward direction. The weight 46 delivers an impact to the arm 86 of the signal output means 88 causing it to assume its second position. The output means 88 is retained in the second position by the hook 160 which engages and retains the arm 86 of the output means 88.

As the temperature of the bimetallic elements 152 and 156 decreases their loaded ends are caused to move in the upward direction towards their first positions. The bimetallic element 162 also moves to the left causing the hook 160 to disengage the arm 86 of the output means 88 allowing it to resume its first position. This occurs after the bimetallic temperature sensing element 12 has assumed its first position. As the temperature increases the weights 24 and 46 are caused to move downwardly into engagement with the hook retaining portions of the elements 12 and 38. As the temperature continues to increase the levers 152 and 156 are prestressed, while the lever 162 moves the hook 160 to the right to the positions shown in FIGURE 3. The signal amplifier 150 is thus automatically reset and positioned to deliver an output signal when the temperature has been sufficiently increased so that the element 12 releases the weight 24 and permits the delivery of an output signal as previously explained.

Although the signal amplifier 150 has been described for delivering an output signal when the temperature increases beyond a predetermined value, the orientation of the bimetallic elements may be reversed so that an output signal is delivered when the temperature decreases beyond a predetermined value.

The FIGURE 4 is a diagrammatic representation of a signal amplifier 170 which is a modified form of the amplifier 150 shown in FIGURE 3. The amplifier 170 differs from the amplifier 150 by including means associated with the bimetallic levers 152, 156 and 162 for varying their temperature.

The FIGURE 4 illustrates the signal amplifier 170 in condition for delivering an output signal. As previously explained when the temperature changes sufficiently so that the bimetallic element 12 moves towards its second position 20 and releases the load 24, the signal output means 88 is placed in its second position.

With the signal output means 88 in its second position and energization applied to the terminals 114 and 116, an electrical path is completed from the terminal 114 through the contacts 92 and 100 to the terminal 118. The terminal 118 is connected to a heating coil 172 associated with the lever 156 and series connected with a heating coil 174 associated with the lever 152. The heating coil 174 has its other end joined to a contact 176 of a relay 178.

The relay 178 has a second contact 180 and an armature 182. The armature 182 has a first position engaging the contact 176 and a second position engaging the contact 180. A spring 184 urges the armature 182 towards its first position, while a lever 186 connected with the bimetallic element 152 maintains the armature 182 in its second position when the load 24 is in its first position as shown in FIGURE 4. The contact 180 of the relay 178 is connected to the terminal 118 through a variable resistor 188 connected in series with a heating coil 190 associated with the lever 162. The armature 182 of relay 178 is directly connected to the terminal 116.

A circuit is completed from the terminal 116 through the energizing coil 192 of a relay 194, the arm 96 and contacts 94, 90, and arm 86 of the output means 88 when in its first position to the terminal 114.

The relay 194 has a contact 196 which is engaged by its armature 198 when its coil 192 is energized. When the coil 192 is deenergized the armature 198 engages the open contact 200 of the relay 194. The contact 196 may be connected to a terminal 114′ while the armature 198 may be joined to a terminal 116′ through the heating element 120.

Thus, when the signal output means 88 is in its second position a circuit is completed from terminal 114 to 116 through the contacts 92, 100 of the output means 88, the heating coils 172 and 174, and the contact 176 in engagement with the armature 182 of the relay 178. Energization of the heating coils 172 and 174 causes the levers 156, 152 respectively to move the loads 46, 24 towards their first positions. When the load 24 assumes its first position the extension 186 of lever 152 places the relay 178 in its second position breaking the circuit through the heating coils 172 and 174.

When energization of the coils 172 and 174 is terminated the temperature of the levers 156, 152 decreases and the load 24 will move in the downward direction towards its second position unless it is retained by the element 12. If the temperature of the element 12 has not been sufficiently reduced so that it assumes its first position shown in FIGURE 4 by the solid lines, the load 24 will move downwardly toward its second position and the armature 182 will disengage the contact 180. If the weight 24 moves downward to a sufficient amount, the relay 178 will assume its first position and the heating coils 172 and 174 will be energized repeating the action just described.

This oscillating action is continued until the element 12 has assumed its first position in which case the load 24 is retained in its first position as shown in FIGURE 4. Under these circumstances the relay 178 is maintained in its second position and energization is supplied to the heating coil 190 for a sufficiently long time to cause its deflection to the left and its release of the signal output means 88 to its first position. Under such circumstances engagement of the contacts 90 and 94 will complete a path between the terminals 114 and 116 through the energizing coil 192 of the relay 194. If the terminals 114′, 116′ are connected to a power source, the closing of the relay 194 results also in the delivery of energy to the heating coil 120 for increasing the temperature of the heating element 12 in a feedback system of the type described in connection with the amplifier 10 of FIGURE 1.

It is noted that the variable resistor 188 is provided to allow adjustment of the time period required to raise the temperature of the bimetallic element 162 for releasing the signal output means 88 from its second position. The energy supplied to the coil 190 is made sufficiently small so that the momentary closing of this circuit by the oscillating action of the bimetallic lever 152 before the load 24 is retained in its first position, does not sufficiently deflect the hook 160 to release the signal output means 88 from its second position.

As previously explained in connection with the amplifier device 10 the amplifier 170 may be modified to deliver output signals at terminals 114′ and 116′ instead of supplying heat by the heating coil 120. A bimetallic element may also be arranged for delivering an output signal when the temperature decreases beyond a predetermined value.

It will, of course, be understood that the descriptions and drawings herein contained are illustrative merely, and that various modifications and changes may be made in the structures disclosed without departing from the spirit of the invention.

What is claimed is:

1. A signal amplifier comprising a first load retaining element sensitive to temperature, a first load retained by said first element and released when said element attains a predetermined temperature, a second load retaining element, a second load conditionally retained by said second element, said second load retaining element being solely responsive to and actuated by said first load instantaneously upon release of said first load by said first element to release said second load, and a signal output means actuated by said second load upon its release by said second element.

2. A signal amplifier comprising a first load retaining element of bimetallic material having an extremity movable between first and second positions responsive to temperature, a first load retained by said first element and released when the extremity of said element moves from its first position toward its second position in response to a change in temperature in the vicinity of said first element, a second load retaining element having an extremity movable between first and second positions, a second load of greater magnitude than said first load conditionally retained by said second element, said second element being solely responsive to and directly actuated by said first load upon its release by said first element to release said second load, and a signal output means actuated by said second load upon its release by said second element.

3. The signal amplifier of claim 2 including load restoring means for placing said first and second loads in their first positions for retention respectively by said first and second elements when the extremities of said elements are in their first positions.

4. A signal amplifier comprising a first load retaining element having an extremity movable between first and second positions responsive to temperature, a first load retained in a first position by the movable extremity of said element when said extremity is in its first position, said first load being released by said first element when its extremity moves from its first position toward its second position in response to a change in temperature, said first load when released moving from its first position to a second position of lower potential energy than its first position, a second load retaining element having an extremity movable between first and second positions, a second load of greater magnitude than said first load movable between first and second positions and retained in its first position by the movable extremity of said second element when said extremity is in its first position, said second load being released by said second element when its extremity moves from its first position toward its second position, said first load when released by said first element solely and directly causing the extremity of said second load retaining element to move from its first position toward its second position, and a signal output means actuated by said second load upon its release by said second element.

5. The signal amplifier of claim 3 in which said second element is pivotally supported for movement of its load retaining extremity by the action of said first load, and including means biasing said element toward its first position, and in which said second load in its first position has a greater potential energy than when it is in its second position.

6. The signal amplifier of claim 5 including a load restoring means for placing said loads in their first positions for retention by their respective elements.

7. The signal amplifier of claim 1 in which said signal output means has first and second positions and is normally in its first position and set to its second position by the release of said loads, and including load restoring means periodically placing said loads in their first positions for retention by their respective elements and resetting said output means to its first position.

8. The signal amplifier of claim 7 including first and second bimetallic levers each having an end movable between first and second positions responsive to temperature, said first and second loads being respectively secured with the ends of said levers, said load restoring means including first and second heating units associated with said first and second levers for heating said levers when said output means is in its second position, the increase in temperature of said levers tending to move their loaded ends toward their said first positions.

9. The signal amplifier of claim 8 including a heating unit connected with said output means, the circuit through said output means with said heating unit being closed and opened by respective positions of said output means.

10. The signal amplifier of claim 1, in which said first load retaining element has an extremity movable between first and second positions responsive to temperature, and including a bimetallic lever having an end movable between first and second positions responsive to temperature, said first load being secured with the movable end of said lever and retained by said first element when said lever and said first element are in their first positions, and heating means applying heat to said lever to increase the temperature thereof except when said lever is in its first position, the increase in temperature of said lever tending to move its loaded end toward its said first position.

11. The signal amplifier of claim 10 in which said signal output means has first and second positions and is set to its second position by the action of said loads moving from their first to second positions, and load restoring means including said heating means associated with and increasing the temperature of said lever when said output means is in its second position, and means resetting said output means to its first position when said loads are in their first positions.

References Cited in the file of this patent

UNITED STATES PATENTS

| | | |
|---|---|---|
| 1,951,446 | Scheibell | Mar. 20, 1934 |
| 2,069,625 | Rich | Feb. 2, 1937 |
| 2,423,316 | Holmes | July 1, 1947 |
| 2,461,903 | Kurtz | Feb. 15, 1949 |
| 2,687,005 | Ingersoll | Aug. 24, 1954 |
| 2,850,870 | Martin | Sept. 9, 1958 |

UNITED STATES PATENT OFFICE
CERTIFICATE OF CORRECTION

Patent No. 3,028,728

April 10, 1962

David E. Sunstein

It is hereby certified that error appears in the above numbered patent requiring correction and that the said Letters Patent should read as corrected below.

Column 4, line 60, for "to" read -- so --; column 9, line 19, for the claim reference numeral "3" read -- 4 --.

Signed and sealed this 23rd day of October 1962.

(SEAL)
Attest:

ERNEST W. SWIDER
Attesting Officer

DAVID L. LADD
Commissioner of Patents